(12) United States Patent
Park

(10) Patent No.: US 8,687,419 B2
(45) Date of Patent: Apr. 1, 2014

(54) ADJUSTING OPERATIONAL PARAMETERS FOR MEMORY CELLS

(75) Inventor: Seong Je Park, Suwon-si (KR)

(73) Assignee: Micron Technology, Inc., Boise, ID (US)

( * ) Notice: Subject to any disclaimer, the term of this patent is extended or adjusted under 35 U.S.C. 154(b) by 206 days.

(21) Appl. No.: 13/204,119

(22) Filed: Aug. 5, 2011

(65) Prior Publication Data

US 2013/0033933 A1 Feb. 7, 2013

(51) Int. Cl.
*G11C 11/34* (2006.01)
(52) U.S. Cl.
USPC ............ 365/185.03; 365/185.18; 365/185.19; 365/185.22
(58) Field of Classification Search
USPC ............... 365/185.03, 185.24, 185.2, 185.19, 365/185.21, 185.18, 189.07, 185.22, 189.04
See application file for complete search history.

(56) References Cited

U.S. PATENT DOCUMENTS

2012/0182810 A1* 7/2012 Radke et al. ............. 365/185.21

* cited by examiner

*Primary Examiner* — Son Sinh
(74) *Attorney, Agent, or Firm* — Schwegman, Lundberg & Woessner, P.A.

(57) ABSTRACT

Techniques and devices relating to adjusting one or more operational parameters for memory cells are provided. One such device may include a detection unit configured to perform one or more reading operations on a set of memory cells to determine an upper bound of the threshold voltages of the set of memory cells. The device may further include a parameter adjustment unit configured to adjust one or more operational parameters for the set of memory cells based, at least in part, on the determined upper bound of the threshold voltages. Other techniques and devices are also provided.

30 Claims, 9 Drawing Sheets

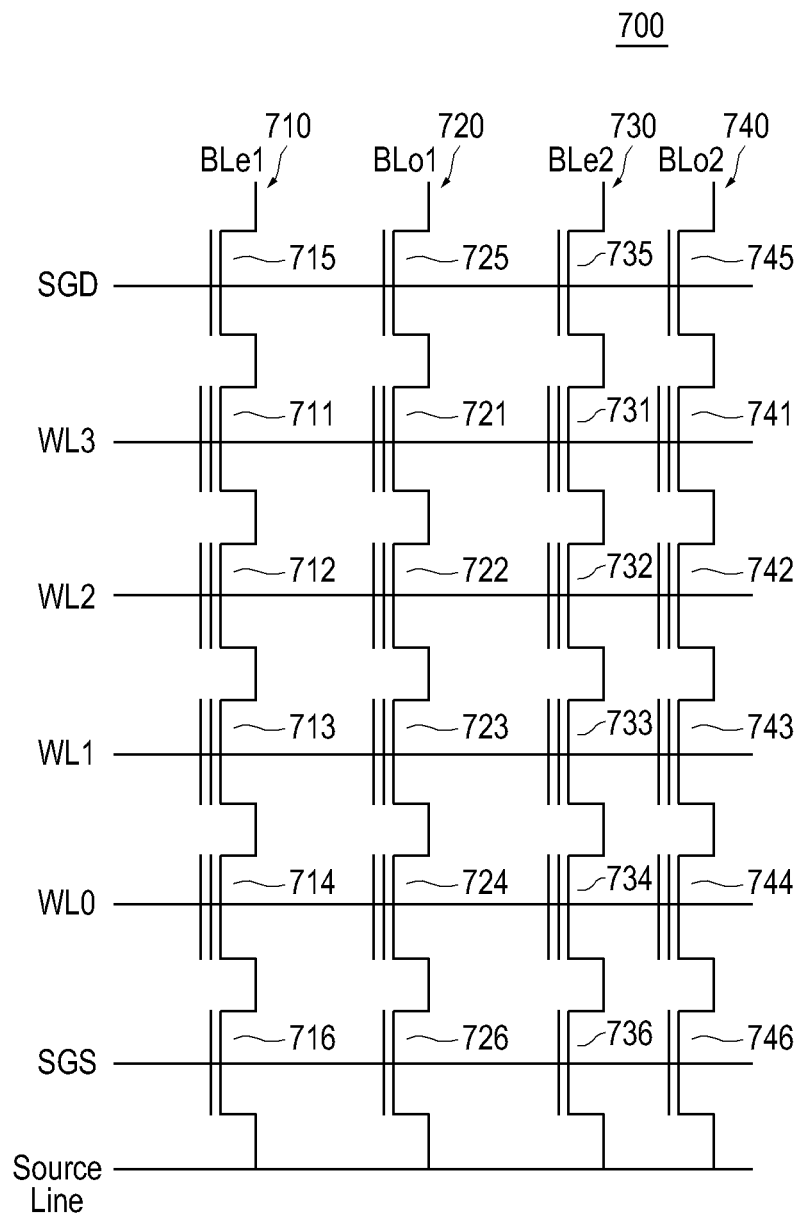

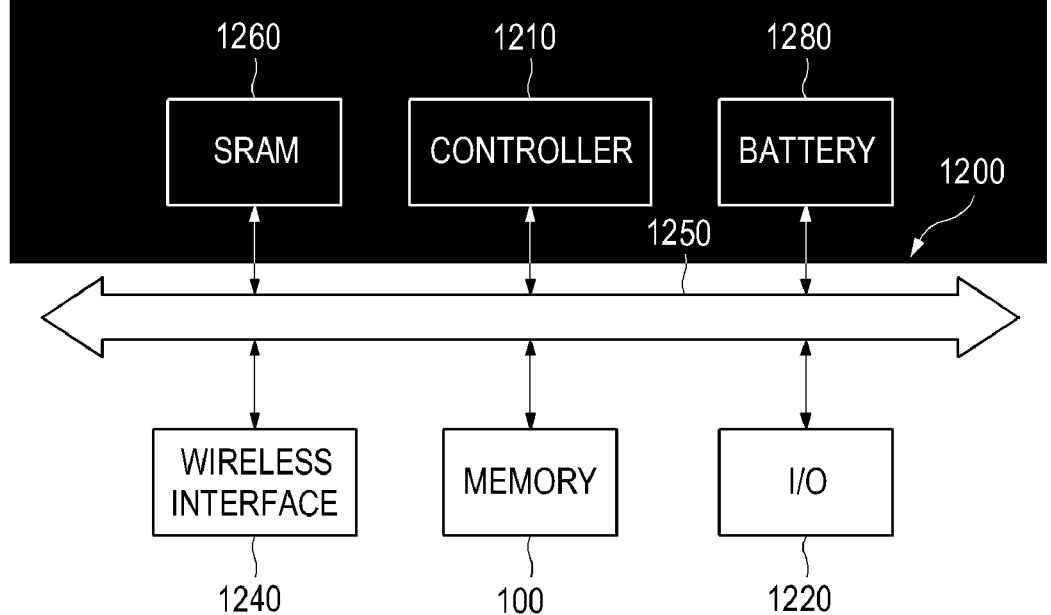

ADJUSTING OPERATIONAL PARAMETERS FOR MEMORY CELLS

TECHNICAL FIELD

The present disclosure relates generally to memory cells and, in particular, to adjusting one or more operational parameters for the memory cells.

BACKGROUND

Non-volatile memory devices are memory devices that maintain data even when electrical power has been removed therefrom. There are a variety of types of non-volatile memory devices. One type of non-volatile memory device includes an electrically erasable and programmable memory device, such as a flash memory device. The flash memory device has an array of flash memory cells respectively including a charge trapping structure (e.g., a floating gate) for storing data therein. Electronic programming and/or erasing operations may be performed on such flash memory cells to tunnel electrons and/or holes into and out of the charge trapping structures of the flash memory cells, and thereby change the threshold voltage of each flash memory cell in accordance with the desired data to be stored therein. The programming/erasing operations may include performing electronic verifying operations to verify whether the flash memory cell has been correctly programmed and/or erased. Further, electronic reading operations may be performed to read the data stored in the programmed and/or erased flash memory cells.

Flash memory devices include one or more controlling mechanisms that are preset with various operational parameters for performing the aforementioned operations on the flash memory cells (e.g., voltages that are to be applied to the flash memory cells during the programming, erasing, and/or reading operations). Typically, those preset operational parameters remain the same throughout the lifecycle of respective flash memory cells. However, these preset values may not be the optimal setting for the given flash memory cells. Further, even in cases where the preset operational parameters are initially set to optimum values, this may no longer hold true as the electrical/mechanical state and the operating environment of the flash memory cells change. Thus, there is a need for techniques that effectively adjust various preset operational parameters for the operations performed on flash memory cells.

BRIEF DESCRIPTION OF THE FIGURES

FIG. 7 shows an example memory block in a memory cell array of an odd/even bit line architecture.

FIG. 12 shows a schematic diagram of an illustrative embodiment of a system including a non-volatile memory device.

DETAILED DESCRIPTION

Figure 1:
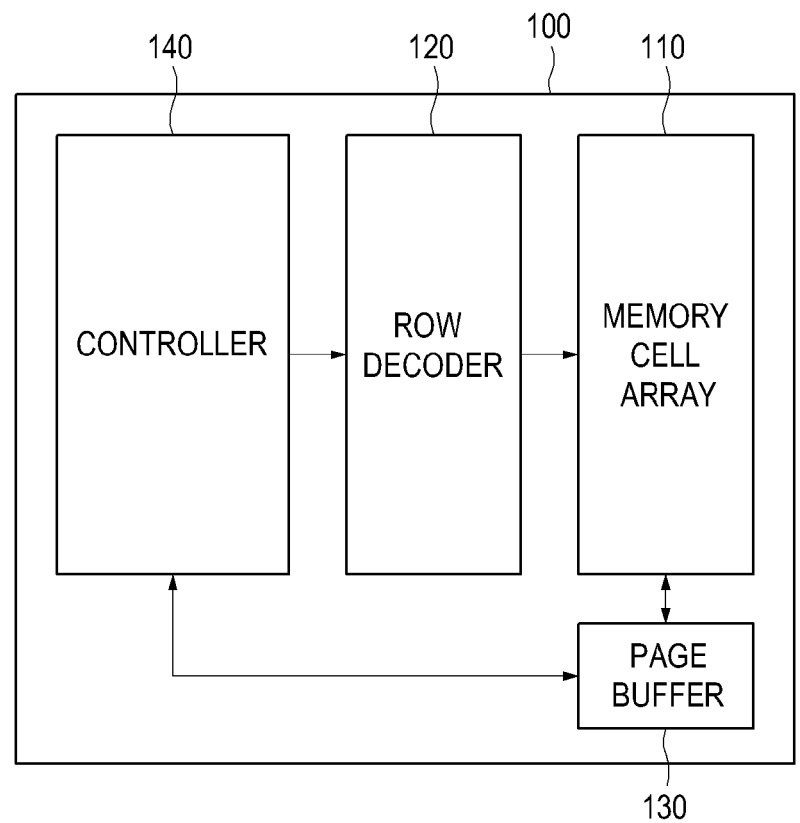
FIG. 1 shows a schematic block diagram of an illustrative embodiment of a NAND-type flash memory device.

Techniques and devices relating to adjusting one or more operational parameters for memory cells are provided. In one embodiment, a device may include a detection unit configured to perform one or more reading operations on a set of memory cells to determine (e.g., detect) an upper bound of the threshold voltages of the set of memory cells. The device may further include a parameter adjustment unit configured to adjust one or more operational parameters for the set of memory cells based, at least in part, on the determined upper bound of the threshold voltages.

The foregoing embodiment is illustrative only and is not intended to be in any way limiting. In addition to the illustrative aspects, embodiments, and features described above, further aspects, embodiments, and features will become apparent by reference to the drawings and the following detailed description.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made. It will be readily understood that aspects of the present disclosure, as generally described herein, and illustrated in the Figures, can be arranged, substituted, combined, separated, and designed in a wide variety of different configurations, all of which are explicitly contemplated herein.

It is to be understood that devices and methods according to the illustrative embodiments of the present disclosure may be implemented in various forms including hardware, software, firmware, special purpose processors, or a combination thereof. For example, one or more example embodiments of the present disclosure may be implemented as an application having a program or other suitable computer-executable instructions that are tangibly embodied on at least one computer-readable media such as a program storage device (e.g., hard disk, magnetic floppy disk, RAM, ROM, CD-ROM, or the like), and executable by any device or machine, including computers and computer systems, having a suitable configuration. Generally, computer-executable instructions, which may be in the form of program modules, include routines, programs, objects, components, data structures, etc. that perform particular tasks or implement particular abstract data types. The functionality of the program modules may be combined or distributed as desired in various embodiments. It is to be further understood that, because some of the constituent device components and methods depicted in the accompanying figures can be implemented in software, the connections between such components (or the logic flow of method operations) may differ depending upon the manner in which the various embodiments of the present disclosure are implemented.

A non-volatile memory device (e.g., a flash memory device) may be made of an array of memory cells respectively having a charge trapping structure (e.g., a floating gate) and one or more controlling mechanisms to control the amount of charge trapped in each charge trapping structure to be commensurate with the data to be programmed into the corresponding memory cell. Each memory cell, when correctly programmed, should hold a certain amount of charge that causes the corresponding memory cell to have a threshold voltage (i.e., a voltage, when applied to the corresponding memory cell, turns it on to conduct currents therethrough) that is within a range corresponding to the data to be programmed thereto. For example, in a case where each memory cell is configured to hold two bits of data, the memory cells programmed to hold data "01" and "00," when correctly programmed, may have to respectively have threshold voltages within two different ranges (e.g., 0.3 [V]~0.7 [V] and 2.3 [V]~2.7[V]). The distributions of the threshold voltages of the memory cells, however, do not always fit into the above target ranges and may shift, narrow, and/or widen as the electric/mechanical state and the operating environment of the memory cells change. As described herein, in at least some embodiments of the present disclosure, the upper bound of a distribution of the threshold voltages of a set of memory cells is determined, and based on the determined upper bound, one or more operational parameters are adjusted for one or more subsequent operations (e.g., programming, erasing, and/or reading operations) that are to be performed on the programmed and/or other memory cells.

FIG. 1 shows a schematic block diagram of an illustrative embodiment of a NAND-type flash memory device. Referring to FIG. 1, a flash memory device 100 may include a memory cell array 110 including an array of memory cells (not shown) respectively coupled to word lines (not shown) and bit lines (not shown) arranged in a matrix form. The flash memory device 100 may further include a row decoder 120 coupled with the word lines and configured to apply one or more voltages thereto to select a set of memory cells in the memory cell array 110, a page buffer 130 coupled to the bit lines and configured to apply thereto and/or detect therefrom one or more voltages and/or currents to erase, program, verify, and/or read the selected set of memory cells, and a controller 140 configured to control the row decoder 120 and the page buffer 130 in accordance with one or more commands provided by an external host (e.g., a central processing unit (CPU)).

Memory cells in the memory cell array 110 may respectively include charge trapping structures for data retention. For example, the memory cells may be floating gate memory cells respectively having floating gates (not shown) for retaining electrons therein. In the above example, each memory cell may be set (e.g., programmed and/or erased by voltages and/or currents applied thereto by the row decoder 120 and the page buffer 130) to hold (or not hold) a certain amount of electrons that makes the corresponding memory cell have a threshold voltage that corresponds to the data to be stored therein. In a case where each memory cell is to hold two bits of data, the memory cells may be set to have a threshold voltage near or within one of four target threshold voltage ranges (e.g., -3.1 [V]~-2.7 [V], 0.3 [V]~0.7 [V], 1.3 [V]~1.7 [V], 2.3 [V]~2.7 [V]) that respectively correspond to data "11," "10," "01," and "00." Herein, the threshold voltage of a memory cell is defined as a voltage that, when applied to the control gate of the memory cell, turns on the memory cell and allows current to flow through the channel located beneath the floating gate of the memory cell.

By way of a non-limiting example, each memory cell may be initially set to have a threshold voltage corresponding to data "11," and thereafter programmed to have one of the threshold voltages corresponding to data "10," "01," and "00." Hereinafter, for the sake of convenience, the memory cells having a threshold voltage corresponding to data "11" may be referred to as being in an "erased state," and the memory cells having a threshold voltage corresponding to one of data "10," "01," and "00" may be referred to as being in a "programmed state."

The controller 140 may be configured to, by way of controlling the row decoder 120 and the page buffer 130, select a set of memory cells in the memory cell array 110 (e.g., a row of memory cells connected to a common word line for a programming operation) and perform one or more erasing and programming operations with one or more erase voltages $V_{ers}$ and/or program voltages $V_{pgm}$ to transition the selected set of memory cells in one of the erased and programmed states to another. Further, the controller 140 may be configured to, by way of controlling the row decoder 120 and the page buffer 130, select a set of memory cells in the memory cell array 110 (e.g., a row of memory cells connected to a common word line) and perform one or more reading operations with one or more read voltages $V_r$ to detect which state each of the selected set of memory cells are in (and thus, detect the data stored therein).

The programming operation may include performing, after applying program voltages to shift the threshold voltages of the selected memory cells to be near or within the target threshold voltage range of a programmed state, a program verifying operation with one of the preset program verify voltages (e.g., the lower bounds of the target threshold voltage ranges for differing programmed states, such as 0.3 [V], 1.3 [V], and 2.3 [V]), to ascertain that all or most of the selected sets of memory cells have threshold voltages greater than the corresponding preset program verify voltage. Further, the erasing operation may include performing, after applying erase voltages to shift the threshold voltages of the selected memory cells, an erase verifying operation with a preset erase verify voltage (e.g., the upper bound of the target threshold voltage range of the erased state, such as -2.7 [V]), to ascertain that all and/or most of the selected sets of memory cells have threshold voltages that are less than the corresponding preset erase verify voltage.

Figure 2:
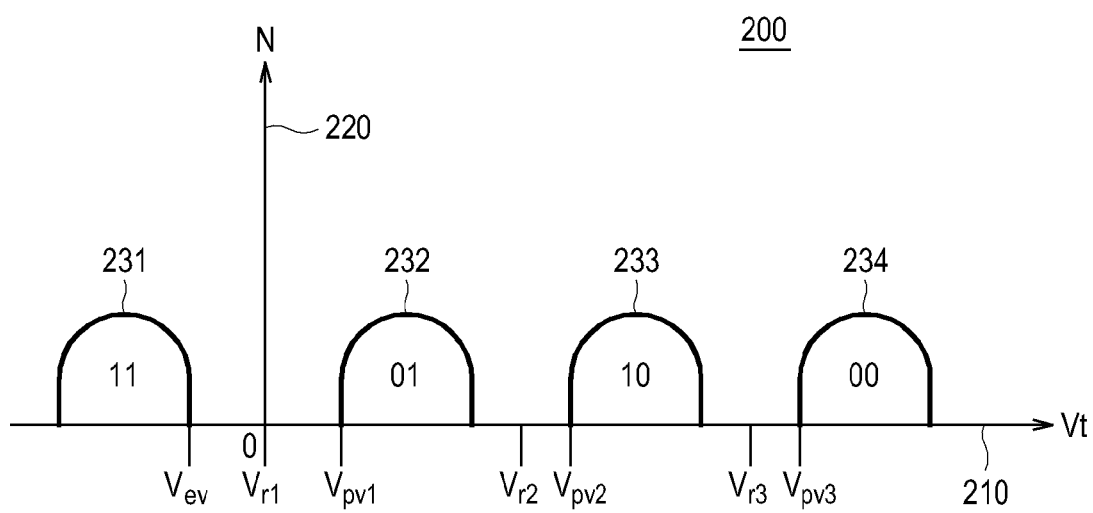
FIG. 2 shows an example graph of threshold voltage distributions of a selected set of memory cells in the memory cell array shown in FIG. 1.

FIG. 2 shows an example graph of threshold voltage distributions of a selected set of memory cells in the memory cell array 110 as shown in FIG. 1. Referring to FIG. 2, a graph 200 includes a horizontal axis 210 indicative of the threshold voltage of a memory cell (i.e., $V_t$), and a vertical axis 220 indicative of the number of memory cells having the corresponding threshold voltage (i.e., N). As shown in the graph 200, the threshold voltages of a selected set of memory cells of the memory cell array 110 (e.g., a row of memory cells connected to a common word line) may collectively form four threshold voltage distributions 231-234 that are respectively near or within four target threshold voltage ranges (e.g., -3.1 [V]~-2.7 [V], 0.3 [V]~0.7 [V], 1.3 [V]~1.7 [V], 2.3 [V]~2.7 [V]) that respectively correspond to data "11," "10," "01," and "00." The horizontal axis 220 of the graph 200 is marked with (a) three read voltages $V_{r1}$-$V_{r3}$ (e.g., 0 [V], 1.0 [V], and 2.0 [V]), which may respectively be preset in the flash memory device 100 to a mid-value between a respective two of the four target threshold voltage distributions (or a value near such mid-value), (b) three program verify voltages $V_{pv1}$-$V_{pv3}$, which may respectively be preset in the flash memory device 100 to the lower bound of a respective one of the threshold voltage distributions 232-234, and (c) one erase verify voltage $V_{ev}$, which may be preset in the flash memory device 100 to the upper bound of the target threshold voltage distribution 231.

A single reading operation may involve, among others, applying a preset read voltage to the control gates of the selected set of memory cells, such that, among the selected set of memory cells, the memory cells that have a threshold voltage less than the read voltage are turned on, whereas those having a threshold voltage greater than the read voltage remain turned off. One or more sense blocks in a page buffer of a flash memory device (e.g., sense blocks (not shown) in the page buffer 130 of FIG. 1) that are respectively coupled to the selected set of memory cells through bit lines may detect whether the selected memory cell connected thereto is turned on or off by sensing the voltages and/or currents in the bit lines (and thus, detect whether the threshold voltage of the memory cell is greater or less than the preset read voltage). For memory cells designed to store two bits of data, to read the data stored therein, three reading operations may be sequentially performed with three preset read voltages $V_{r1}$-$V_{r3}$ that are respectively between two of the aforementioned four target threshold voltage ranges (e.g., 0 [V], 1 [V], and 2 [V]) to ascertain the whereabouts of the threshold voltages of the selected set of memory cells.

Further, in programming a set of memory cells, as is described with reference to FIG. 1, a verifying operation may be performed after applying program voltages to shift the threshold voltages of the set of memory cells. The verifying operation includes performing a reading operation with a program verify voltage to ascertain whether the set of memory cells have been programmed to have threshold voltages that are greater than the program verify voltage as desired. For example, after applying program voltages to program a set of memory cells to be in programmed state "10," as a verifying operation, a reading operation may be performed on the set of programmed memory cells with a program verify voltage $V_{pv2}$ to verify whether all or most of the set of programmed memory cells in fact have threshold voltages greater than program verify voltage $V_{pv2}$. If it is determined that more than a preset number (e.g., zero) of memory cells have threshold voltages less than program verify voltage $V_{pv2}$, than the program voltages may be reapplied to at least some of the memory cells (e.g., the memory cells having a threshold voltage less than the corresponding program verify voltage) to increase their threshold voltages to be at least greater than the desired level.

The set of memory cells programmed as above will have, at least immediately after the completion of the programming operation, a threshold voltage distribution whose lower bound is equal to or greater than the corresponding program verify voltage. Its upper bound, however, may vary between different set of memory cells and/or the same set of memory cells programmed at different time periods depending on the electrical/mechanical state and/or the operating environment of the memory cells at the time they are programmed. This may be so even right after the completion of a programming operation. For example, as the number of erasing/programming operations performed on a set of memory cells increases, the gate dielectrics of the set of memory cells may become more and more degraded. Degraded memory cells, when programmed, may exhibit a greater upper bound in their threshold voltage distribution, compared to relatively fresh memory cells.

Figure 3:
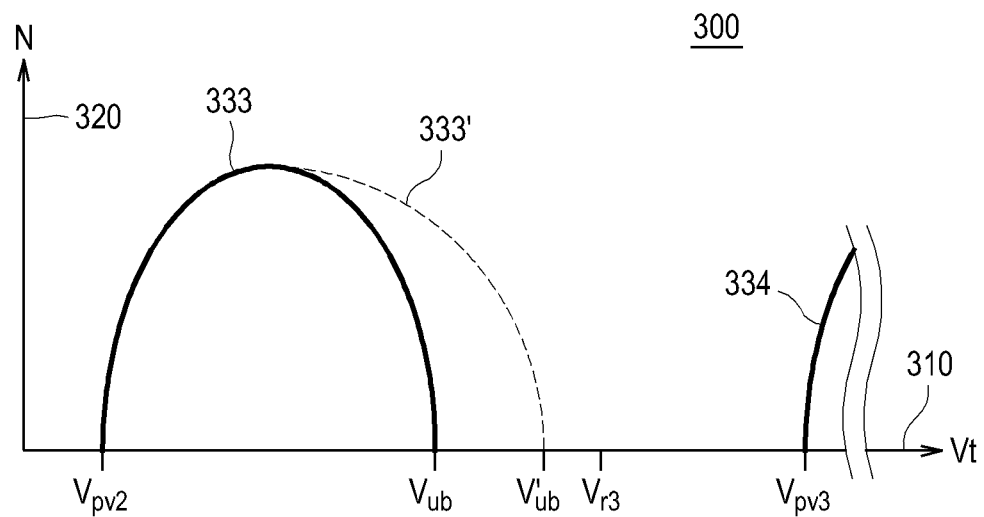
FIG. 3 shows an example graph of threshold voltage distributions of a set of memory cells programmed at two different time periods.

In this regard, FIG. 3 shows an example graph of threshold voltage distributions of a set of memory cells programmed at two different time periods. Referring to FIG. 3, a graph 300 includes horizontal and vertical axes 310 and 320 indicative of the threshold voltage of a memory cell (i.e., $V_t$) and the number of memory cells having the corresponding threshold voltage (i.e., N), respectively. As shown in the graph 300, the threshold voltage distribution of a set of memory cells programmed to store data "01" at an earlier time (i.e., a threshold voltage distribution 333) may have a smaller upper bound (i.e., an upper bound $V_{ub}$ of the threshold voltage distribution 333) compared to that of the same set of memory cells programmed at a later time (i.e., an upper bound $V_{ub'}$ of a threshold voltage distribution 333'), even immediately after being programmed with the same program voltage and the same program verify voltage $V_{pv2}$. As can be seen from FIG. 3, an increase in the upper bound will result in the decrease of the margin between the upper bound and a neighboring read voltage $V_{r3}$ and a program verify voltage $V_{pv3}$ of the neighboring programmed state "00," which in some cases may significantly increase the likelihood of an erroneous reading of the memory cells.

Flash memory devices, such as the flash memory device 100 shown in FIG. 1, may be preset with one or more operational parameters (e.g., an erase verify voltage, one or more program voltages, one or more program verify voltages, and one or more read voltages) that provide enough margins between the upper bounds of the threshold voltage distributions of erased/programmed states and the neighboring read and program verify voltages to compensate for such increase in the upper bounds of the threshold voltage distributions. In this regard, it should be noted that while setting the program verify voltages to a higher level to compensate for the above phenomena may prevent erroneous readings of memory cells, setting the program verify voltages to a lower level may be more beneficial in preserving the integrity of the memory cells and delay their degradation, especially the degradation of their gate dielectrics. As such, for the memory cells that exhibit narrow threshold voltage distributions (i.e., lesser upper bounds) when programmed and thus provide enough margins between the threshold voltage distributions of erased/programmed states to guarantee their correct reading, the preset program verify voltages and/or other preset operational parameters may be adjusted to a lower level.

According to at least one embodiment of the present disclosure, a controller of a flash memory device, such as the controller 140 of the flash memory device 100 in FIG. 1, may include one or more elements configured to determine (e.g., detect) the upper bound of a set of memory cells and adjust the program verify voltages and/or other operational parameters for the set of memory cells and/or other memory cells of the flash memory device based on the determined upper bound.

Figure 4:
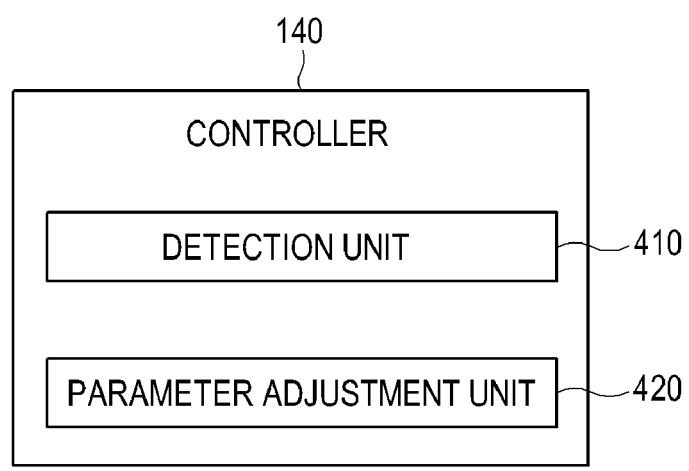
FIG. 4 shows a detailed block diagram of an illustrative embodiment of the controller shown in FIG. 1.

In the following, some elements of controller 140 in FIG. 1 are explained in more detail with reference to FIGS. 4-9B. FIG. 4 shows a detailed block diagram of an illustrative embodiment of the controller shown in FIG. 1. Referring to FIG. 4, the controller 140 may include a detection unit 410 and a parameter adjustment unit 420.

As used herein, the term "unit" refers to a functional block that is implemented in hardware, firmware, software, and any combination thereof that perform one or more functions, such as processing of an input to produce an output. By way of a non-limiting example, a unit may include an application specific integrated circuits (ASIC), a field-programmable gate arrays (FPGA), an electronic circuit, a shared, dedicated, or group processor, a combinatorial logic circuit, and/or other suitable components that provide the described functionality.

The detection unit 410 may be configured to perform one or more reading operations on a set of programmed memory cells in the memory cell array 110 (e.g., memory cells that have been programmed to respectively have threshold voltages above a program verify voltage) with one or more reference voltages greater than the program verify voltage to determine an upper bound of the threshold voltages of the set of programmed memory cells. For example, the detection unit 410 can be configured to iteratively perform reading operations with one or more reference voltages $V_{ref}$ that are incrementally increased (e.g., by $\Delta V$) with each iteration to detect one or more memory cells having a threshold voltage greater than the respective reference voltages, until the number of the detected one or more memory cells is equal to or less than a particular (e.g., a preset or dynamically set), number T (e.g., one of 0, 1, 2, 16, 32).

Figure 5:
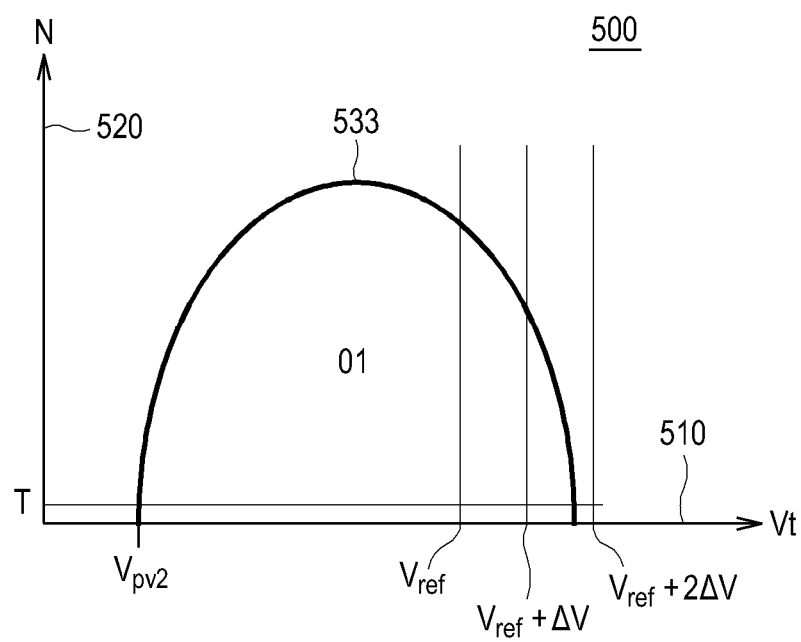
FIG. 5 shows an example graph illustrating an upper bound detection operation performed by the detection unit shown in FIG. 4.

In this regard, FIG. 5 shows an example graph illustrating an upper bound detection operation performed by the detection unit shown in FIG. 4. Referring to FIG. 5, a graph 500 includes horizontal and vertical axes 510 and 520 indicative of the threshold voltage of a memory cell (i.e., $V_t$) and the number of memory cells having the corresponding threshold voltage (i.e., N), respectively. After completion of a programming operation to store data "01" to a set of memory cells such that a voltage distribution 533 in FIG. 5 is formed, the detection unit 410 may perform a series of reading operations on the set of programmed memory cells with a series of reference voltages $V_{ref}$, $V_{ref}+\Delta V$, and $V_{ref}+2\Delta V$, until the number of memory cells having a threshold voltage greater than the corresponding reference voltage is equal to or less than a particular number T. In the example illustrated in FIG. 5, the detection unit 410 may detect $V_{ref}+2\Delta V$ as the upper bound of threshold voltage distribution 533.

In another embodiment, the upper bound may be determined by a series of reading operations on the set of programmed memory cells with a series of reference voltages $V_{ref}$, $V_{ref}-\Delta V$, and Vref-$2\Delta V$, until the number of memory cells having a threshold voltage greater than the corresponding reference voltage is equal to or more than a particular number T. The starting value $V_{ref}$ may be the reading voltage above the target distribution. It should be appreciated that the upper bound of threshold voltages, as used herein, is not necessarily limited to a value that is equal to or greater than the largest of the threshold voltages of the set of programmed memory cells, but may be, as determined by the detection unit 410 in accordance with the aforementioned algorithm, a value that is somewhat smaller than the largest threshold voltage.

Returning to FIG. 4, in one embodiment, the detection unit 410 may be further configured to store data indicative of the determined upper bound of the threshold voltages in a storage element. By way of a non-limiting example, the storage element may be one of a latch in the page buffer 130 or the controller 140, a redundant memory cell (not shown) in the memory cell array 110, or a flag memory cell (not shown) in the memory cell array 110 (see FIG. 1), so as to later use them in adjusting the operational parameters for ensuing erasing, programming, and/or reading operations. Each row of memory cells in the memory cell array 110 may include one or more redundant memory cells that may replace regular memory cells in case they fail, and may further include one or more flag cells that may be used to store program state, parity bits, and/or other data relating to the operation of the flash memory device 100 as well known in the art. The spare and/or flag memory cells may retain their data even when the power is cut off from the flash memory device 100.

In one embodiment, the detection unit 410 may be configured to perform one or more reading operations right after the completion of a programming operation or a program verifying operation. The upper bound determined as such may accurately convey the state of the charge trapping structures of the set of programmed memory cells.

The parameter adjustment unit 420 may be configured to adjust one or more operational parameters for the set of programmed memory cells based on the upper bound of the threshold voltages as determined by the detection unit 410. Examples of the operational parameters include, but are not limited to, an erase verify voltage, one or more program voltages, one or more program verify voltages, and one or more read voltages. In one embodiment, the parameter adjustment unit 420 may be configured to decrease one or more operational parameters (e.g., a program voltage(s), an erase or program verify voltage(s), and/or a read voltage(s)) if the upper bound of the threshold voltages is determined to be less than a particular value, and increase one or more operational parameters if the upper bound of the threshold voltages is determined to be greater than the particular value. In another embodiment, the parameter adjustment unit 420 may be configured to adjust one or more parameters in proportion to the magnitude of the determined upper bound relative to a particular value.

Figure 6A:
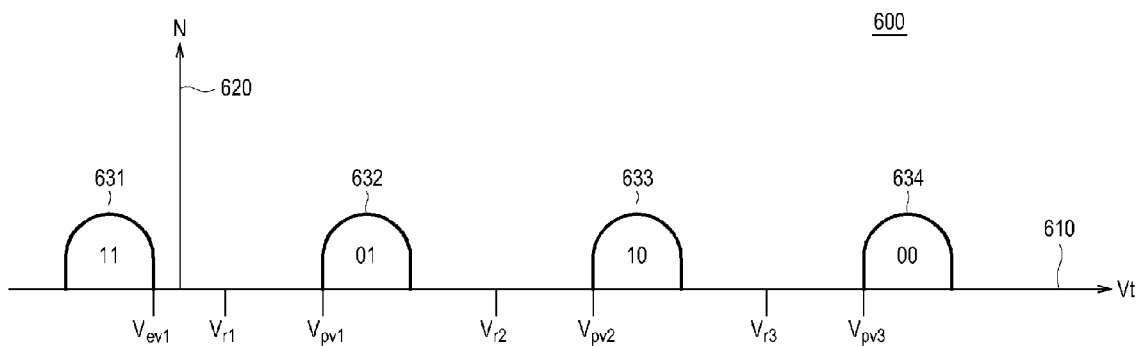
FIGS. 6A and 6B respectively show example graphs illustrating threshold voltage distributions of a set of memory cell programmed in accordance with preset operational parameters and operational parameters adjusted by the parameter adjustment unit shown in FIG. 4.
Figure 6B:
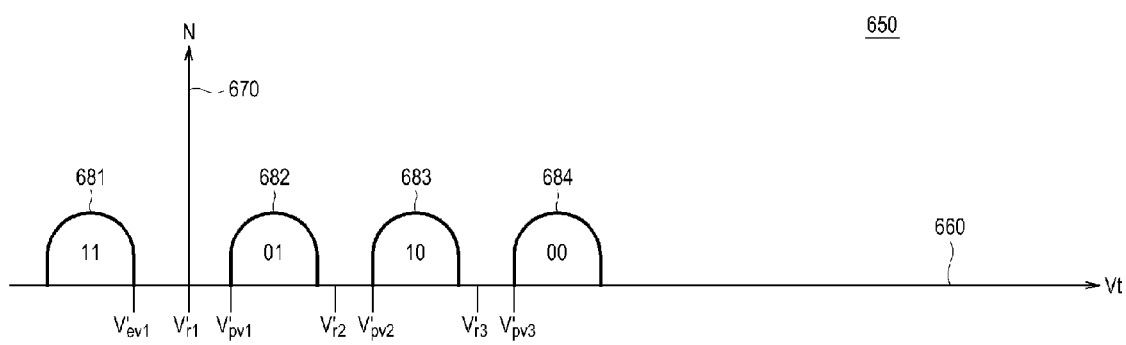

In this regard, FIGS. 6A and 6B respectively show example graphs illustrating threshold voltage distributions of a set of memory cell programmed in accordance with preset operational parameters and operational parameters adjusted by the parameter adjustment unit shown in FIG. 4. Referring to FIGS. 6A and 6B, graphs 600 and 650 respectively include horizontal and vertical axes 610 and 620 and horizontal and vertical axes 660 and 670, where the horizontal axes are indicative of the threshold voltage of a memory cell (i.e., $V_t$) and the vertical axes are indicative of the number of memory cells having the corresponding threshold voltage (i.e., N). An erase verify voltage $V_{ev1}$, three program verify voltages $V_{pv1}$-$V_{pv3}$, and three read voltages $V_{r1}$-$V_{r3}$ in FIG. 6A are all operational parameters preset to the flash memory device 100. Further, four threshold voltage distributions 631-634 are all threshold voltage distributions of a set of memory cells coupled to a common word line that have been programmed and/or erased in accordance with the above preset operational parameters. Likewise, an erase verify voltage $V'_{ev1}$, three program verify voltages $V'_{pv1}$-$V'_{pv3}$, and three read voltages $V'_{r1}$-$V'_{r3}$ in FIG. 6B are all operational parameters that have been adjusted by the parameter adjustment unit 420, and four threshold voltage distributions 681-684 are all threshold voltage distributions of the above set of memory cells that have been programmed and/or erased in accordance with the above adjusted operational parameters. As can be seen from FIGS. 6A and 6B, when memory cells are fresh and not degraded, the difference between the upper bounds of threshold voltage distributions 632-634 and corresponding program verify voltages $V_{pv1}$-$V_{pv3}$ (i.e., the width of threshold voltage distributions 632-634) may be relatively narrow to a degree that would allow decreasing of the preset operational parameters (and thus, the margin therebetween) (see FIG. 6B) without increasing the likelihood of an erroneous reading of the memory cells to an unacceptable level. If the memory cells deteriorate due to repeated usage and their threshold voltage distributions widen to a degree that would hamper correct reading of the memory cells, the operational parameters may be increased to provide enough margin between the threshold voltage distributions.

In some cases, of the operational parameters of the flash memory device 100, the magnitude of the largest program verify voltage (e.g., $V_{pv3}$ in FIGS. 2 and 3) may be a dominant factor in causing the memory cell degradation. In one embodiment, the detection unit 410 may be configured to perform one or more reading operations on a set of memory cells with one or more reference voltages greater than the second largest of the plurality of program verify voltages (e.g., $V_{pv2}$ in FIGS. 2 and 3), so as to determine an upper bound of the threshold voltage distribution of the set of memory cells that is second largest in magnitude (e.g., threshold voltages distributions 233 and 333 in FIGS. 2 and 3). Further, in the above embodiment, the parameter adjustment unit 420 may be configured to adjust the largest of the program verify voltages based on the determined upper bound of the threshold voltages of the set of multi-level memory cells.

It should be appreciated that the determination/adjustment techniques described herein may be applied to numerous types of architectures with modifications and variations as appropriate per the respective architecture types. In the following, embodiments as applied to various types of flash memory architectures in accordance with the present disclosure are explained in more detail.

In one example, flash memory devices may be classified as odd/even bit line architecture or all bit line architecture depending on their bit line arrangements. In the odd/even bit line architecture, bit lines are divided into even bit lines (i.e., BLe) and odd bit lines (i.e., BLo), whereas in the all bit line architecture, no such distinctions are made. FIG. 7 shows an example memory block in a memory cell array of an odd/even bit line architecture. Referring to FIG. 7, a memory block 700 may include a plurality of strings (e.g., strings 710, 720, 730, and 740). The plurality of strings may respectively include (a) two select gates (e.g., select gates 715 and 716, 725 and 726, 735 and 736, and 745 and 746) respectively connected to selection lines SGD and SGS and (b) a matrix of memory cells connected in series between the two select gates (e.g., memory cells 711-714, 721-714, 731-714, and 741-744). The strings are divided into even strings (e.g., strings 710 and 730) and odd strings (e.g., strings 720 and 740), one end of which are respectively connected to even bit lines (e.g., BLe1 and BLe2) and odd bit lines (e.g., BLo1 and BLo2). The other end of strings 710-730 are connected to a common source line. Each row of memory cells (e.g., memory cells 711, 721, 731, and 741) is connected to a common word line (e.g., WL3). In the example odd/even bit line architecture described above, memory cells connected along a common word line and connected to even bit lines (e.g., memory cells 711 and 731) (hereinafter referred to as "even memory cells") may be selected and programmed at one time, while memory cells connected along a common word line and connected to odd bit lines (e.g., memory cells 721 and 741) (hereinafter referred to as "odd memory cells") are selected and programmed at another time.

In an embodiment implemented with regard to the configuration shown in FIG. 7, a detection unit (e.g., detection unit 410 in FIG. 4) may be configured to perform one or more reading operations to determine the upper bound of the threshold voltages of a set of even/odd memory cells, and a parameter adjustment unit (e.g., parameter adjustment unit 420 in FIG. 4) may be configured to adjust one or more operational parameters for the set of odd/even memory cells based on the upper bound of the threshold voltages of the set of even/odd memory cells determined by the detection unit.

In another example, conventional flash memory devices may be classified as a single level cell (SLC) architecture or a multiple level cell (MLC) architecture depending on the number of bits stored per memory cell in their memory cell array. Memory cells of an SLC architecture respectively store a single bit of data, whereas those of an MLC architecture respectively store two or more bits of data. In other embodiments, memory cells may store a fractional bit of data (e.g., 0.5 bits, 1.5 bits, etc.). The flash memory device 100 described in conjunction with FIGS. 1-6B is a two-level MLC architecture in which each memory cell stores two bits of data (i.e., data "11," "01," "10," or "00").

While various techniques are available in programming such MLC architectures, a page-split algorithm is one of the most commonly used. A page, as commonly used in the pertinent art, refers to a unit of data that may be programmed and/or read in a single programming or reading operation. In the page-split algorithm, each bit stored in a memory cell may be programmed by a single separate programming operation, and may be referred to as a bit page. In a two-level MLC architectures, for example, the least significant bit (LSB) or the LSB page of the two bits to be stored in a memory cell (e.g., "1" of "01") may be programmed with a single programming operation (i.e., an LSB page programming operation), and thereafter, the most significant bit (MSB) or the MSB page of the two bits (e.g., "0" of "01") may be programmed with another programming operation (i.e., an MSB page programming operation).

Figure 8:
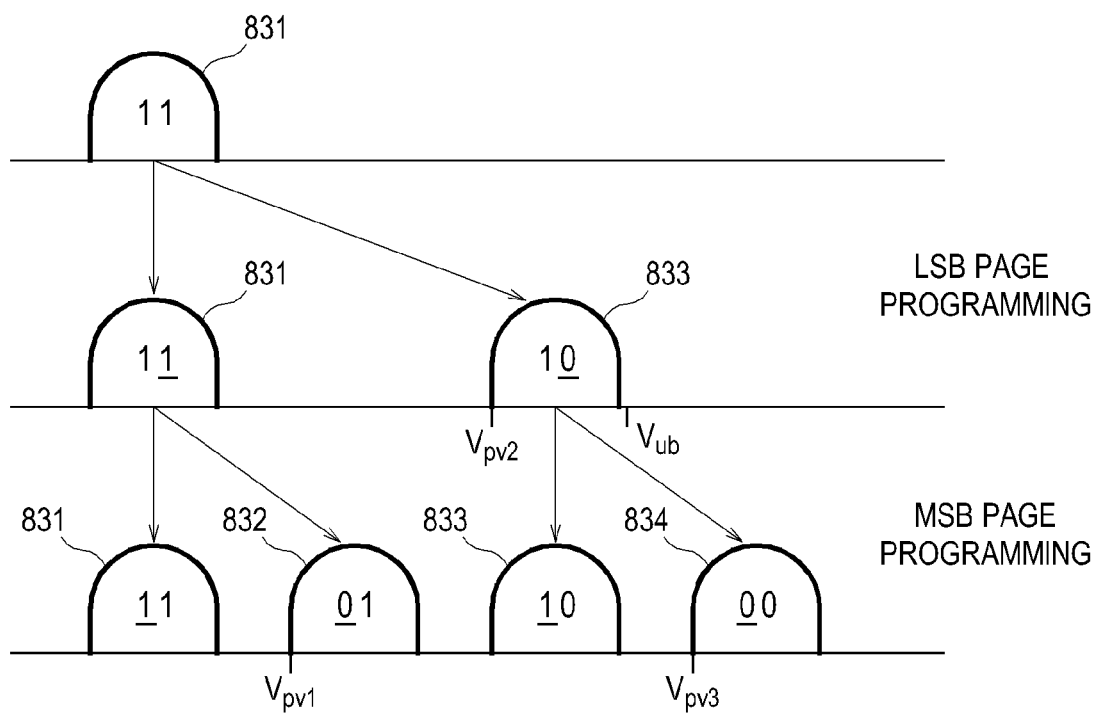
FIG. 8 shows a schematic diagram illustrating an example page-split algorithm used in a two-level MLC architecture.

FIG. 8 shows a schematic diagram illustrating an example page-split algorithm used in a two-level MLC architecture. Referring to FIG. 8, initially a set of memory cells may be all set to an erased state (i.e., initially set to have a threshold voltage within or near a target threshold voltage range 831 that corresponds to data "11"). Thereafter, an LSB page programming operation may be performed on the set of memory cells, such that the memory cells in the set of memory cells that are to be programmed with LSB page "0" are transitioned from erased state "11" to a programmed state "10" (i.e., shift the threshold voltage of the memory cells to be within or near a target threshold voltage range 833 that corresponds to data "10"), while the memory cells that are to be programmed with LSB page "1" remain in erased state "11." After the completion of the LSB page programming, an MSB page programming operation may be performed on the same set of memory cells, such that, among the memory cells in programmed state "11," the memory cells that are to be programmed with MSB page "0" are transitioned from erased state "11" to a programmed state "01" (i.e., shift the threshold voltage of the memory cells to be within or near a target threshold voltage range 832 that corresponds to data "01"), while the memory cells that are to be programmed with MSB page "1" remain in erased state "11." Further, during the MSB page programming operation, among the memory cells in programmed state "10," the memory cells that are to be programmed with MSB page "0" are transitioned from erased state "10" to a programmed state "00" (i.e., shift the threshold voltage of the memory cells to be within or near a target threshold voltage range 834 that corresponds to data "00"), while the memory cells that are to be programmed with MSB page "1" remain in state "10."

In an embodiment implemented with regard to the configuration shown in FIG. 8, a detection unit (e.g., detection unit 410 in FIG. 4) may be configured to perform one or more reading operations on a set of memory cells programmed with a first page of data (e.g., a set of memory cells on which an LSB page programming operation has been performed) to determine the upper bound of a resulting threshold voltage distribution (e.g., threshold voltage distribution 833). Further, a parameter adjustment unit (e.g., parameter adjustment unit 420 in FIG. 4) may be configured to adjust not only one or more operational parameters associated with the programming operation for programming another first page of data (e.g., the program and/or program verify voltages to be applied to another LSB page programming operation, such as $V_{pv2}$ in FIG. 8), but also one or more operational parameters associated with a programming operation for programming a second page of data (e.g., the program and/or program verify voltages associated with a subsequent MSB page programming operation, such as $V_{pv1}$ and $V_{pv3}$ in FIG. 8) into the same set of cells based on the upper bound determined by the detection unit (e.g., the upper bound $V_{ub}$ of threshold voltage distribution 833 determined by the detection unit after the LSB page programming operation).

It should be appreciated that the aforementioned embodiments may be modified to be implemented to three or higher level MLC architectures. For example, in a three-level architecture in which each memory cell stores three bits of data (i.e., data "111," "011," "001," "101," "100," "000," "010," or "110"), three bits of data (e.g., "101") may be split into LSB page (e.g., "1" of "101"), central significant bit (CSB) page (e.g., "0" of "101"), and MSB page (e.g., "1" of "101"), and the LSB, CSB, and MSB pages may be programmed with three separate LSB, CSB, and MSB page programming operations. In this embodiment, a parameter adjustment unit may be configured to adjust one or more operational parameters associated with a programming operation for programming a CSB and/or MSB page based on the determined upper bound of the threshold voltage distribution resulting from programming of a prior LSB page. In one embodiment, the detection unit may be configured to perform a reading operation on a set of MLCs, the set of MLCs having been programmed to respectively have threshold voltages above one of a plurality of MLC program verify voltages, the one of the plurality of MLC program verify voltages being an intermediate one of the plurality of MLC program verify voltages (e.g., a MLC program voltage other than the largest and/or the smallest MLC program verify voltages). Further, in the above embodiment, the parameter adjustment unit may be configured to adjust one or more other MLC program verify voltage (s) (e.g., the largest of the MLC program voltages) based on the determined upper bound of the threshold voltages of the set of MLCs.

In yet another example, an incremental step pulse programming (ISPP) algorithm is widely used to fine tune the distribution of the threshold voltages of programmed memory cells. In the ISPP algorithm, a series of program voltage pulses progressively incremented by an incremental value (e.g. $\Delta V$) is applied to a set of memory cells to shift their threshold values to a desired level. In some examples, one or more verify voltage pulses may be applied between two program voltage pulses. Hereinafter, the aforementioned program pulses may be referred to as an ISPP pulse.

Figure 9A:
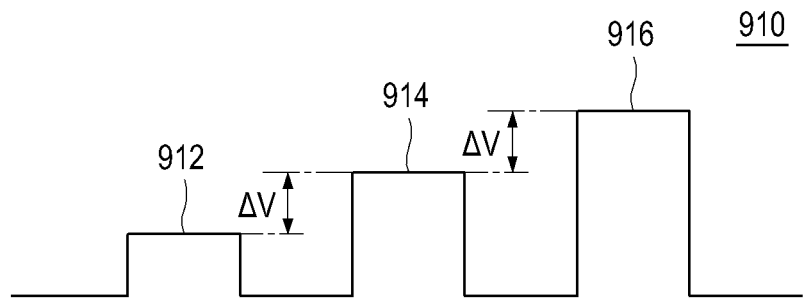
FIGS. 9A and 9B show two examples of ISPP pulses.
Figure 9B:
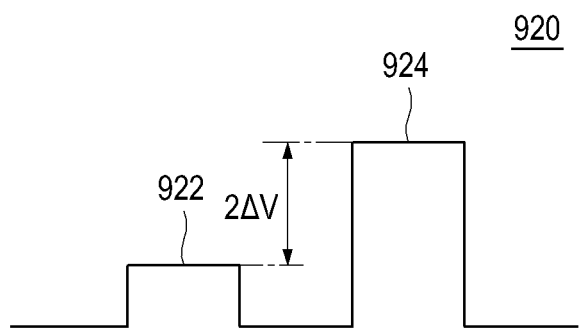

FIGS. 9A and 9B show two example ISPP pulses in accordance with the present disclosure. Referring to FIGS. 9A and 9B, a first ISPP pulse 910 may include three program voltage pulses 912, 914, and 916 that are incremented by $\Delta V$. A second ISPP pulse 920 may include two program voltage pulses 922 and 924 that are incremented by $2\Delta V$. Compared to second ISPP pulse 920, first ISPP pulse 910 may take longer time in programming a set of memory cells, but may more finely tune and/or narrow the distribution of the threshold voltages of the set of programmed memory cells. Conversely, compared to first ISPP pulse 910, second ISPP pulse 920 may take shorter time in programming a set of memory cells, but the resulting threshold voltage distributions may be wider compared to those attained by applying first ISPP pulse 910. For example, second ISPP pulse 920 may be used in programming relatively fresh memory cells, whereas first ISPP pulse 910 may be used in programming degraded memory cells.

In an embodiment implemented with regard to the configuration shown in FIGS. 9A and 9B, a parameter adjustment unit in accordance with present disclosure (e.g., parameter adjustment unit 420 in FIG. 4) may be configured to adjust a parameter (e.g., the size of the voltage increment used in or duration of) an ISPP pulse based on the upper bound of the threshold voltages determined by a detection unit. For example, the parameter adjustment unit may be configured to increase the voltage increment (e.g., from $\Delta V$ to $2\Delta V$) when the determined upper bound is less than a particular value, and decrease the voltage increment (e.g., from $2\Delta V$ to $\Delta V$) when the determined upper bound is greater than the particular value. In another example, the parameter adjustment unit may be configured to adjust the voltage increment in proportion to the magnitude of the determined upper bound relative to a particular value.

While a number of different examples have been described, it should be appreciated that those skilled in the art would easily combine and/or modify the configurations in the aforementioned examples. For example, the determination and adjustment techniques described herein may be implemented with some modification in flash memory devices including a combination of the even/odd bit line, MLC, and ISPP architectures. In one embodiment, the detection unit may be configured to perform one or more reading operations for a set of memory cells programmed in an LSB EVEN page programming operation (i.e., a programming operation for programming an LSB page into even memory cells among a row of memory cells along a common word line), and the parameter adjustment may be configured to adjust one or more operational parameters associated with programming operations for programming different types of pages (e.g., LSB ODD page, MSB EVEN page, and/or MSB ODD page).

Figure 10:
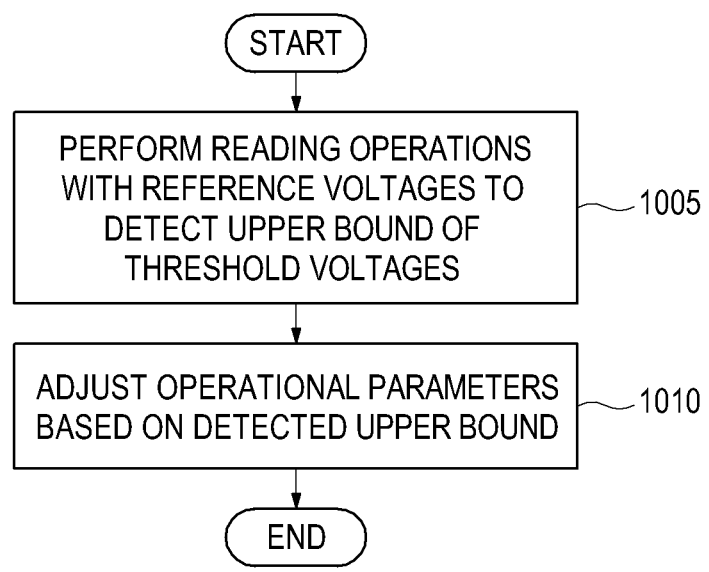
FIG. 10 shows an example flow diagram of an illustrative embodiment for adjusting one or more operational parameters of a flash memory device.

In the following, some processes performed by some elements of a flash memory device are explained in more detail with reference to FIGS. 10 and 11. FIG. 10 shows an example flow diagram of an illustrative embodiment for adjusting one or more operational parameters of a flash memory device. Referring to FIG. 10, a detection unit in a flash memory device performs one or more reading operations on a set of programmed memory cells (i.e., a set of memory cells that have been programmed to respectively have threshold voltages above a program verify voltage) with one or more reference voltages greater than the program verify voltage to determine an upper bound of the threshold voltages of the set of programmed memory cells (block 1005). In one embodiment, the detection unit may perform a reading operation on the set of programmed memory cells with a reference voltage to determine one or more memory cells having a threshold voltage greater than the reference voltage. If the number of the determined one or more memory cells is greater than a particular number, the detection unit may perform another reading operation on the set of memory cells with another reference voltage greater than the reference voltage to determine one or more memory cells having a threshold voltage greater than the another reference voltage. The above operations may be repeated until the number of the determined one or more memory cells is equal to or less than the particular number. Upon completion of the reading operations, the detection unit may determine the reference voltage at the time of completion as the upper bound of the threshold voltages. In another embodiment, the detection unit may store data indicative of the determined upper bound of the threshold voltages in a storage element of the flash memory device.

In block 1010, a parameter adjustment unit of the flash memory device adjusts one or more operational parameters for the set of memory cells (or other memory cells) based on the determined upper bound of the threshold voltages, and the process is terminated. Examples of the one or more operational parameters include, but are not limited to, an erase verify voltage, one or more program voltages, one or more program verify voltages, and one or more read voltages for the set of memory cells. In one embodiment, the parameter adjustment unit may decrease the one or more operational parameters if the upper bound of the threshold voltages is determined to be less than a particular value, and increase the one or more operational parameters if the upper bound of the threshold voltage distribution is determined to be greater than the particular value.

In another embodiment, the parameter adjustment unit may adjust a size of a parameter (e.g., a voltage increment or duration) of an ISPP pulse based on the determined upper bound of the threshold voltages. In one example, the parameter adjustment unit may increase the voltage increment if the determined upper bound is less than a particular value, and decrease the voltage increment if the determined upper bound is greater than the particular value. In another example, the parameter adjustment unit may adjust a timing or a duration of an ISPP pulse based on the determined upper bound of the threshold voltages. For example, the parameter adjustment unit may decrease the program pulse duration (e.g., the duration of each program voltage pulse making up the ISPP pulse) if the determined upper bound is less than a particular value, e.g. a preset value, and increase the program pulse duration if the determined upper bound is greater than the particular value.

In yet another embodiment, in a case where the detection unit has performed one or more reading operations on a set of memory cells programmed with a first page of data to determine an upper bound of threshold voltages thereof, the parameter adjustment unit may adjust one or more operational parameters for a programming operation for programming a second page of data different from the first page of data based on the determined upper bound of the threshold voltages. The first page of data can be data of a page of LSB data, and the second page of data can be a page of CSB data or a page of MSB data. In some embodiments, the parameter adjustment unit may adjust one or more operational parameters for a second set of memory cells different from the set of memory cells based on the determined upper bound of the threshold voltages.

Figure 11:
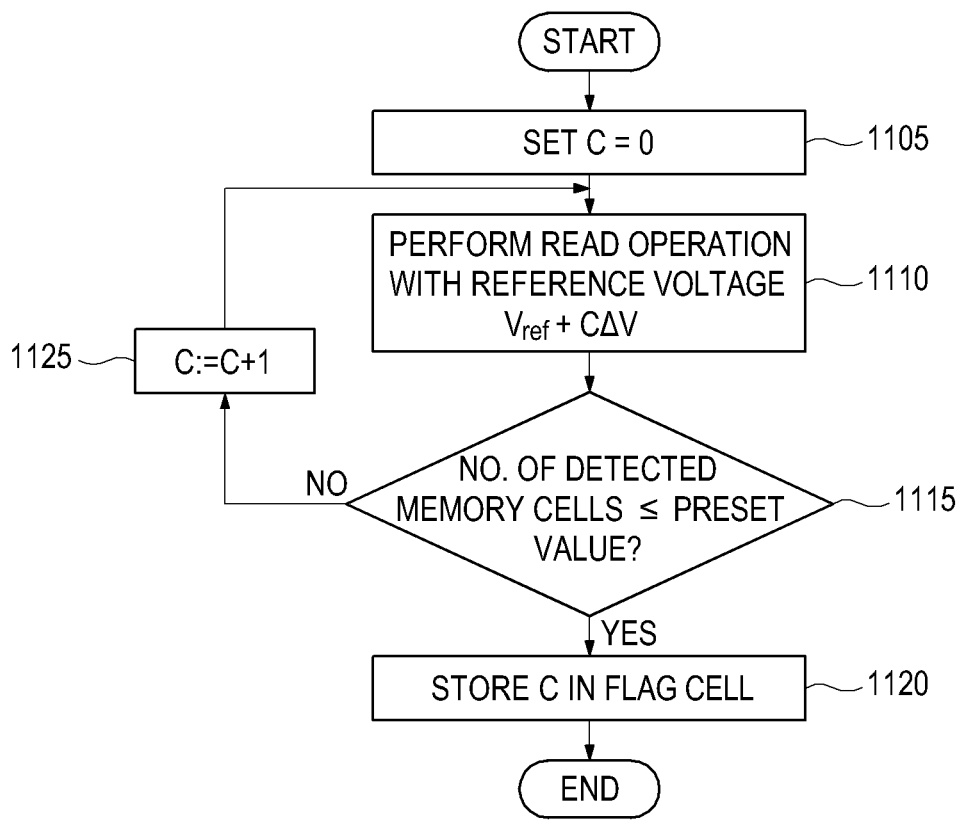
FIG. 11 shows an example flow diagram of an illustrative embodiment for determining an upper bound of threshold voltages of a set of memory cells.

FIG. 11 shows an example flow diagram of an illustrative embodiment for determining an upper bound of threshold voltages of a set of programmed memory cells. Referring to FIG. 11, a detection unit of a flash memory device, upon completion of programming of a page of data, may set a count number C to zero (block 1105). In block 1110, the detection unit performs a read operation with a reference voltage, which is equal to $V_{ref}+C\Delta V$, where $V_{ref}$ is a particular value, e.g. a preset value, and in block 1115, determines whether the number of memory cells among the set of programmed memory cells that have a threshold voltage greater than the reference voltage is equal to or less than a particular value T. If the number is less than or equal to T, the detection unit stores C in a flag cell as data indicative of the upper bound of the threshold voltages of the set of programmed memory cells (block 1120), and aborts the process. If the number is determined to be greater than T, the detection unit increments C by a particular amount (e.g., 1) (block 1125), and the process is moved to block 1110.

In an alternative embodiment, in block 1110, the detection unit may perform a read operation with a reference voltage, which is equal to $V_{ref}-C\Delta V$, where $V_{ref}$ is a preset value. The starting value $V_{ref}$ may be the reading voltage above the target distribution. Further, in this embodiment, the detection unit may determine whether the number of memory cells among the set of programmed memory cells that have a threshold voltage greater than the reference voltage is equal to or greater than a particular value T. If the number is equal to or greater than T, the detection unit may store C in a flag cell as data indicative of the upper bound of the threshold voltages of the set of programmed memory cells (block 1120), and abort the process. If the number is determined to be less than T, the detection unit may increment C by a particular amount (e.g., 1) (block 1125), and the process may be moved to block 1110.

It should be appreciated that the structural and functional configurations of the flash memory device and its elements described in conjunction with FIGS. 1-11 are indicative of a few ways in which the flash memory device may be implemented. The techniques described herein may be applied to other types of flash memory devices. For example, in some embodiment, the techniques may be applied to flash memory devices of an SLC architecture. Further, it should be appreciated that the techniques described herein may be easily implemented to numerous types of memory devices other than the flash memory device.

FIG. 12 shows a schematic diagram of an illustrative embodiment of a system including a non-volatile memory device (e.g., a flash memory device 100 of FIG. 1). A system 1200 may be used in devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information either wirelessly or over a wire connection. The system 1200 may be used in any of the following systems: a wireless local area network (WLAN) system, a wireless personal area network (WPAN) system, or a cellular network.

The system 1200 may include a controller 1210, an input/output (I/O) device 1220 (e.g., a keypad, display), the flash memory device 100 of FIG. 1, a wireless interface 1240, and a static random access memory (SRAM) 1260 and coupled to each other via a bus 1250. A battery 1280 may supply power to the system 1200 in one embodiment. The memory device may include a NAND memory, a flash memory, a NOR memory, or the like.

The controller 1210 may include, for example, one or more microprocessors, digital signal processors, micro-controllers, or the like. The flash memory device 100 may be used to store messages transmitted to or by the system 1200. The flash memory device 100 may also optionally be used to store instructions that are executed by controller 1220 during the operation of the system 1200, and may be used to store user data either generated, collected or received by the system 1200 (such as image data). The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 1220 may be used to generate a message. The system 1200 may use the wireless interface 1240 to transmit and receive messages to and from a wireless communication network with a radio frequency (RF) signal. Examples of the wireless interface 1240 may include an antenna, or a wireless transceiver, such as a dipole antenna, although the scope of the present disclosure is not limited in this respect. Also, the I/O device 1220 may deliver a voltage reflecting what is stored as either a digital output (if digital information was stored), or as analog information (if analog information was stored). While an example in a wireless application is provided above, embodiments of the present invention may also be used in non-wireless applications as well.

One skilled in the art will appreciate that, for this and other methods disclosed herein, the functions performed in the methods may be implemented in differing order. Furthermore, the outlined acts and operations are only provided as examples, and some of the acts and operations may be optional, combined into fewer acts and operations, or expanded into additional acts and operations without detracting from the essence of the disclosed embodiments.

The present disclosure is not to be limited in terms of the particular embodiments described in this application, which are intended as illustrations of various aspects. For example, instead of floating gate flash memory devices, charge trap memory devices may be used. Many modifications and variations can be made, as will be apparent to those skilled in the art. Functionally equivalent methods and devices within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., " a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made. Accordingly, the various embodiments disclosed herein are not intended to be limiting.

What is claimed is:

1. A method of adjusting an operational parameter for memory cells, the method comprising:
determining an upper bound of threshold voltages of the memory cells including performing a read operation on a portion of the memory cells programmed with a first page of data to determine an upper bound of threshold voltages, the first page of data being data of a page of least significant bit (LSB) data, the threshold voltages of the memory cells being above a program verify voltage; and
adjusting an operational parameter for the memory cells for a programming operation of a second page of data different from the first page of data, based, at least in part, on the determined upper bound of the threshold voltages, the second page of data being a page of central significant bit (CSB) data or a page of most significant bit (MSB) data based, at least in part, on the determined upper bound of the threshold voltages.

2. The method of claim 1, wherein the set of memory cells comprise memory cells corresponding to one of a plurality of threshold voltage distributions respectively formed by at least some of the threshold voltages.

3. The method of claim 1, wherein performing a reading operation comprises:
performing a reading operation on the set of memory cells with a reference voltage to detect memory cells of the set having a threshold voltage greater than the reference voltage; and
based on a determination that the number of the detected memory cells is equal to or less than a particular number, determining the reference voltage as the upper bound of the threshold voltages.

4. The method of claim 3, wherein the reference voltage is a first reference voltage and performing a reading operation comprises, if the number of the detected memory cells is greater than the particular number, performing a second reading operation on the set of memory cells with a second reference voltage greater than the first reference voltage to detect memory cells having a threshold voltage greater than the second reference voltage.

5. The method of claim 1, wherein performing a reading operation further comprises storing data indicative of the determined upper bound of the threshold voltages in a storage element.

6. The method of claim 1, wherein the operational parameter comprises at least one operation parameter from a group of operation parameters including an erase verify voltage, a program voltage, a program verify voltage, and a read voltage for the set of memory cells.

7. The method of claim 6, wherein adjusting the operational parameter comprises adjusting the parameter in proportion to a magnitude of the determined upper bound relative to a particular value.

8. The method of claim 1, wherein adjusting the operational parameter comprises, adjusting a parameter of an incremental step pulse programming (ISPP) pulse based, at least in part, on the determined upper bound of the threshold voltages.

9. The method of claim 8, wherein the parameter comprises a size of a voltage increment.

10. The method of claim 9, wherein adjusting a size of a voltage increment comprises:
based on a determination that the determined upper bound is less than a particular value, increasing the voltage increment; and
based on a determination that the determined upper bound is greater than the particular value, decreasing the voltage increment.

11. The method of claim 8, wherein the parameter comprises a duration of a program voltage pulse of the ISPP pulse.

12. The method of claim 11, wherein adjusting a duration of a program voltage pulse of the ISPP pulse comprises:
based on a determination that the determined upper bound is less than a particular value, decreasing the duration of the program voltage pulse; and
based on a determination that the determined upper bound is greater than the particular value, increasing a duration of the program voltage pulse.

13. The method of claim 1, wherein performing a reading operation comprises performing a reading operation on a set of multi-level memory cells, the set of multi-level memory cells having been programmed to respectively have threshold voltages above one of a plurality of multi-level cell (MLC) program verify voltages, the one of the plurality of MLC program verify voltages being the second largest of the plurality of MLC program verify voltages, and wherein adjusting an operational parameter comprises adjusting the largest of the MLC program verify voltages based, at least in part, on the determined upper bound of the threshold voltages of the set of multi-level memory cells.

14. The method of claim 1, wherein performing a reading operation comprises performing a reading operation on a set of multi-level memory cells, the set of multi-level memory cells having been programmed to respectively have threshold voltages above one of a plurality of multi-level cell (MLC) program verify voltages, the one of the plurality of MLC program verify voltages being an intermediate one of the plurality of MLC program verify voltages, and wherein adjusting an operational parameter comprises adjusting the largest of the MLC program verify voltages based, at least in part, on the determined upper bound of the threshold voltages of the set of multi-level memory cells.

15. The method of claim 1, wherein adjusting the operational parameter further comprises adjusting an operational parameter for a second set of memory cells different from the set of memory cells based, at least in part, on the determined upper bound of the threshold voltages.

16. The method of claim 1, wherein performing a reading operation comprises:
performing a reading operation on the set of memory cells with a reference voltage to detect memory cells of the set having a threshold voltage greater than the reference voltage; and
if the number of the detected memory cells is equal to or greater than a particular number, determining the reference voltage as the upper bound of the threshold voltages.

17. A device configured to perform a method comprising:
determining an upper bound of threshold voltages of the memory cells including performing a read operation on a portion of the memory cells programmed with a first page of data to determine an upper bound of threshold voltages, the first page of data being data of a page of least significant bit (LSB) data, the threshold voltages of the memory cells being above a program verify voltage; and
adjusting an operational parameter for the memory cells for a programming operation of a second page of data different from the first page of data, based, at least in part, on the determined upper bound of the threshold voltages, the second page of data being a page of central significant bit (CSB) data or a page of most significant bit (MSB) data based, at least in part, on the determined upper bound of the threshold voltages.

18. A device comprising:
a detection unit configured to determine an upper bound of threshold voltages of a set of memory cells and perform a read operation on a portion of the set of memory cells programmed with a first page of data to determine an upper bound of threshold voltages, the first page of data being data of a page of least significant bit (LSB) data; and
a parameter adjustment unit configured to adjust an operational parameter for the set of memory cells based, at least in part, on the determined upper bound of the threshold voltages, the parameter adjustment unit being further configured to adjust an operational parameter for a programming operation for programming a second page of data different from the first page of data based, at least in part, on the determined upper bound of the threshold voltages, the second page of data being a page of central significant bit (CSB) data or a page of most significant bit (MSB) data.

19. The device of claim 18, wherein the detection unit is further configured to:
perform a first read operation on the set of memory cells with a reference voltage to detect memory cells of the set having a threshold voltage greater than the reference voltage, and
based on a determination that the number of the detected memory cells is equal to or less than a particular number, determine the reference voltage as the upper bound of the threshold voltages.

20. The device of claim 19, wherein the reference voltage is a first reference voltage and the detection unit is further configured to, based on the determination that the number of the detected memory cells is greater than the particular number, perform a second read operation on the set of memory cells with a second reference voltage greater than the first reference voltage to detect memory cells having a threshold voltage greater than the second reference voltage.

21. The device of claim 18, wherein the detection unit is further configured to store data indicative of the determined upper bound of the threshold voltages in a storage element.

22. The device of claim 18, wherein the operational parameter comprises at least one operation parameter from a group including an erase verify voltage, a program voltage, a program verify voltage, and a read voltage for the set of memory cells.

23. The device of claim 22, wherein the parameter adjustment unit is further configured to adjust the parameter in proportion to a magnitude of the determined upper bound relative to a particular value.

24. The device of claim 18, wherein the parameter adjustment unit is further configured to adjust a parameter of an incremental step pulse programming (ISPP) pulse based, at least in part, on the determined upper bound of the threshold voltages.

25. The device of claim 24, wherein the parameter comprises a voltage increment and the parameter adjustment unit is configured to:
based on a determination that the determined upper bound is less than a particular value, increase the voltage increment; and
based on a determination that the determined upper bound is greater than the particular value, decrease the voltage increment.

26. The device of claim 24, wherein the parameter comprises a duration of a program voltage pulse of the ISPP pulse, and the parameter adjustment unit is configured to:
based on a determination that the determined upper bound is less than a particular value, decrease a duration of the program voltage pulse; and
based on a determination that the determined upper bound is greater than the particular value, increase the duration of the program voltage pulse.

27. The device of claim 18, wherein the detection unit is further configured to perform a reading operation on a set of multi-level memory cells, the set of multi-level memory cells having been programmed to respectively have threshold voltages above one of a plurality of multi-level cell (MLC) program verify voltages, the one of the plurality of MLC program verify voltages being the second largest of the plurality of MLC program verify voltages, the parameter adjustment unit being further configured to adjust the largest of the MLC program verify voltages based, at least in part, on the determined upper bound of the threshold voltages of the set of multi-level memory cells.

28. The device of claim 18, wherein the detection unit is further configured to perform a reading operation on a set of multi-level memory cells, the set of multi-level memory cells having been programmed to respectively have threshold voltages above one of a plurality of multi-level cell (MLC) program verify voltages, the one of the plurality of MLC program verify voltages being an intermediate one of the plurality of MLC program verify voltages, the parameter adjustment unit being further configured to adjust the largest of the MLC program verify voltages based, at least in part, on the determined upper bound of the threshold voltages of the set of multi-level memory cells.

29. The device of claim 18, wherein the parameter adjustment unit is configured to adjust an operational parameter for a second set of memory cells different from the set of memory cells based, at least in part, on the determined upper bound of the threshold voltages.

30. A method of adjusting an operational parameter for one or more memory cells, the method comprising:
determining an upper bound of threshold voltages of the one or more memory cells; and
adjusting a parameter of an incremental step pulse programming (ISPP) pulse for the one or more memory cells by changing a duration of a program voltage pulse of the ISPP pulse based, at least in part, on the determined upper bound of the threshold voltages.

* * * * *

UNITED STATES PATENT AND TRADEMARK OFFICE
CERTIFICATE OF CORRECTION

PATENT NO. : 8,687,419 B2  Page 1 of 1
APPLICATION NO. : 13/204119
DATED : April 1, 2014
INVENTOR(S) : Seong Je Park It is certified that error appears in the above-identified patent and that said Letters Patent is hereby corrected as shown below:

On the Title page, under "Primary Examiner", in column 2, line 1, delete "Sinh" and insert -- Dinh --, therefor.

Signed and Sealed this
Twelfth Day of August, 2014

Michelle K. Lee
*Deputy Director of the United States Patent and Trademark Office*